United States Patent [19]

Hoshino

[11] Patent Number: 4,786,871
[45] Date of Patent: Nov. 22, 1988

[54] NMR IMAGING METHOD AND APPARATUS

[75] Inventor: Kazuya Hoshino, Tokyo, Japan

[73] Assignee: Yokogawa Medical Systems, Limited, Tokyo, Japan

[21] Appl. No.: 65,358

[22] PCT Filed: Oct. 29, 1986

[86] PCT No.: PCT/JP86/00545
§ 371 Date: Jun. 23, 1987
§ 102(e) Date: Jun. 23, 1987

[87] PCT Pub. No.: WO87/02568
PCT Pub. Date: May 7, 1987

[30] Foreign Application Priority Data

Oct. 30, 1985 [JP] Japan .................. 60-243598

[51] Int. Cl.⁴ .............................. G01R 33/20
[52] U.S. Cl. .................... 324/309; 324/312
[58] Field of Search ........... 324/307, 309, 310, 312; 128/653

[56] References Cited

U.S. PATENT DOCUMENTS 4,625,171  11/1986  Sekihara et al. .......... 324/312
4,674,046   6/1987  Ozeki et al. .............. 324/312
4,710,716  12/1987  Keren et al. .............. 128/653

Primary Examiner—John Chapman
Assistant Examiner—Louis M. Arana
Attorney, Agent, or Firm—Moonray Kojima

[57] ABSTRACT

An NMR imaging method and apparatus according to the present invention which enables collection of data to be effected within a minimum scanning time which can be desired for each object of inspection is arranged such that projection data concerning the object is collected from a plurality of directions, a direction in which the number of samples in the warp direction is minimized is obtained on the basis of the collected projection data, and then the scanning coordinate system is rotated in accordance with the obtained direction to collect data on the basis of the Fourier transformation method.

2 Claims, 3 Drawing Sheets

NMR IMAGING METHOD AND APPARATUS

TECHNICAL FIELD

The present invention relates to improvements in an NMR imaging method and apparatus for obtaining a cross-sectional image of an object of inspection by utilizing nuclear magnetic resonance. More particularly, the present invention pertains to an NMR imaging method and apparatus wherein the scanning time required to collect NMR signals by the two-dimensional Fourier transformation method is reduced.

BACKGROUND ART

An NMR imaging apparatus has a magnet section including a static magnetic field coil for producing a uniform static magnetic field $H_O$ and a gradient magnetic field coil for producing a magnetic field which extends in the same direction as the static magnetic field $H_0$ and which has a linear gradient in each of the x, y and z directions, a transmission and reception section which is arranged to apply radio-frequency pulses (radio-frequency electromagnetic wave) to an object of inspection placed within the magnetic field formed by the magnet section and to detect an NMR signal from the object, a control and image processing section which is arranged to control the operation of the transmission and reception section and that of the magnet section and to process detected data to thereby display an image, and other sections or members.

Figure 6:
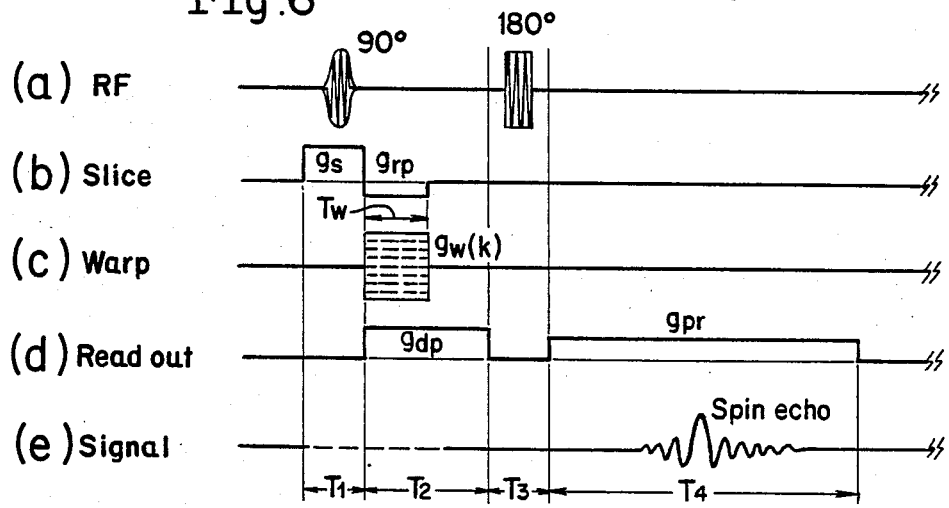

The NMR imaging apparatus having the above-described arrangement is driven in the pulse sequence based on the two-dimensional Fourier transformation method as shown in FIG. 6 in order to perform a predetermined data collecting operation. The operation carried out at each time during the data collection is as follows.

The time $T_1$ . . . The z-gradient magnetic field $g_s$ is applied, and a 90° pulse (an RF signal) is applied (see FIG. 6(b) and 6(a)). Thus, spins within a specific slice plane of the object alone are selectively excited.

The time $T_2$ . . . In order to generate a spin echo signal during the subsequent time $T_4$, the x-gradient magnetic field $g_{dp}$ is applied (see FIG. 6(d)) to give the spins a phase difference corresponding to the x-coordinate (prephase). Further, in order to obtain positional data (positional data in the y-direction) in a direction perpendicular to the gradient $g_{pr}$ which is applied when a signal readout operation is carried out, the y-gradient magnetic field $g_{w(k)}$ is applied (see FIG. 6(c)) during the time $T_w$ ($<T_2$) to give the spins a phase corresponding to the y-coordinate (warp). Further, the z-gradient magnetic field $g_{rp}$ is applied during the time $T_w$ (see FIG. 6(b)) in order to remove the z-direction phase shift of the spins caused in the slicing operation (rephase).

The time $T_3$ . . . In order to generate a spin echo, a 180° pulse signal is applied (see FIG. 6(a)) to invert the whole spins (inversion).

The time $T_4$ . . . In order to obtain positional data in the x-direction, the x-gradient magnetic field (projection magnetic field ) $g_{pr}$ is applied (see FIG. 6(d)), and a spin echo signal is detected (see FIG. 6(e)).

Figure 7:
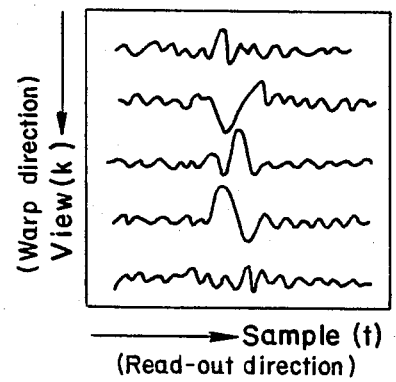

The spin echo signal detected during the time $T_4$ corresponds to one of the lines obtained by subjecting to the two-dimensional Fourier transformation the distribution of intensities of signals from the spins in the object (determined by the spin density and the relaxation phenomenon). The selection of lines is effected by means of the product of the amount of application of the y-gradient, i.e., the magnitude of the y-gradient magnetic field $g_{w(k)}$, and the application time $T_w$. Accordingly, all the view data which is necessary for reconstruction of an image, i.e., a series of data shown in FIG. 7, is collected by repeating the sequence shown in FIG. 6 while varying the y-gradient magnetic field $g_{w(k)}$. A series of data in the read-out direction shown in FIG. 7 is observed for each view as a spin echo signal, while one of the data in the warp direction is obtained for each view.

The scanning time in the Fourier transformation method is known to be substantially proportional to the number of samples in the warp direction. On the other hand, variations in the number of samples in the read-out direction are absorbed into, for example, the stand-by time between successive views and therefore substantially independent of the scanning time. Accordingly, it is only, necessary, in order to shorten the scanning time, to reduce the number of samples in the warp direction.

The conventional NMR imaging apparatus suffers, however, from the following problems. Since an appropriate number of samples is selected from several different numbers of samples determined in advance, collection of data is not necessarily effected with an optimal scanning time, that is, a necessary, adequate and minimum scanning time, for each individual object. To the contrary, collection of data is carried out in a direction in which the scanning time increases; therefore, there is a fear of the burden on the object increasing and also a risk of an artifact being generated due to the movement of the object's body.

DISCLOSURE OF THE INVENTION

It is an object of the present invention to provide an NMR imaging method and apparatus which enables scanning to be effected within a minimum time in accordance with a cross-sectional configuration of each object of inspection.

Figure 1:
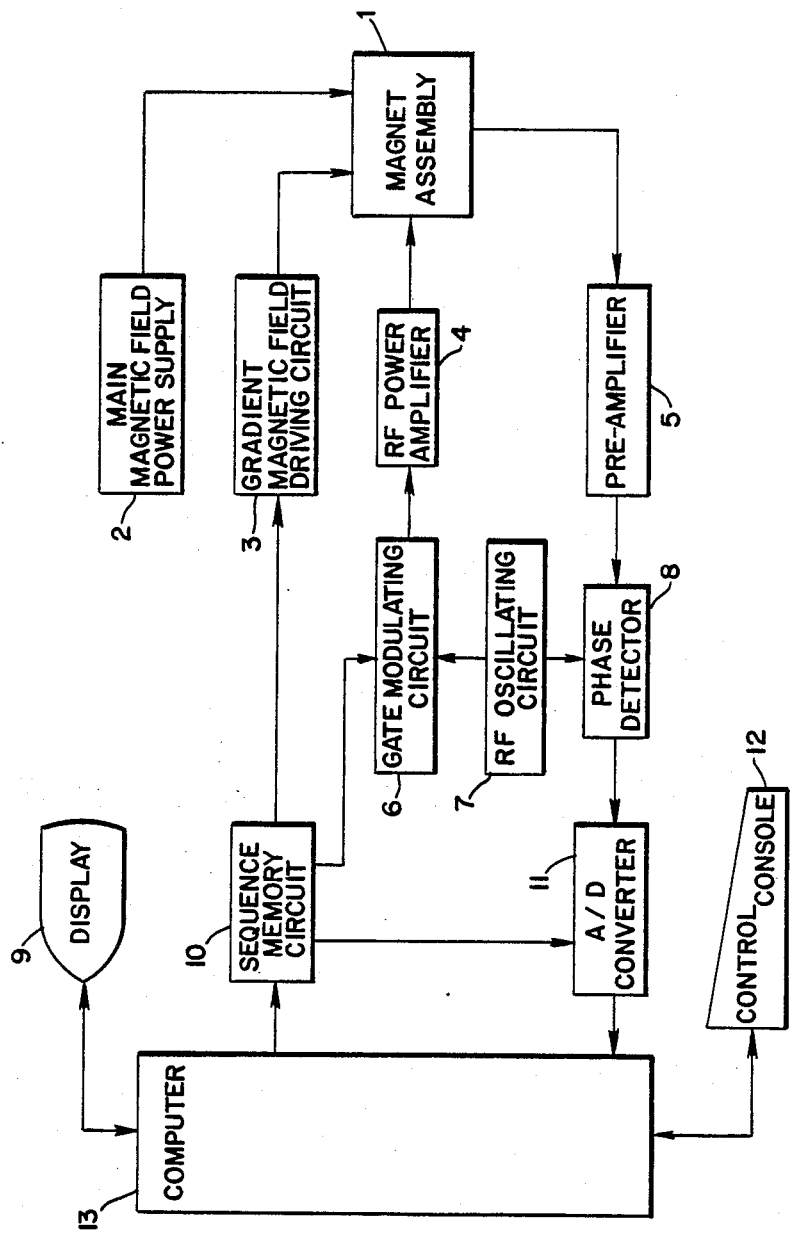

To this end, in the NMR imaging method and apparatus according to the present invention, projection data concerning an object of inspection is collected from a plurality of directions, and a direction in which the number of samples in the warp direction is minimized is obtained on the basis of the projection data, and then, the scanning coordinate system is rotated in accordance with the obtained direction to collect data on the basis of the Fourier transformation method. BRIEF DESCRIPTION OF THE DRAWINGS FIG. 1 is a block diagram of one embodiment of the present invention;

FIGS. 2 to 5(a)–5(b) are views employed to describe the operation of the embodiment of the present invention;

FIG. 6 shows a pulse sequence in the two-dimensional Fourier transformation method; and FIG. 7 schematically illustrates data obtained in the two-dimensional Fourier transformation.

BEST MODE FOR CARRYING OUT THE INVENTION

The present invention will be described hereinunder in detail with reference to the drawings.

FIG. 1 is a block diagram of one embodiment of the present invention. A magnet assembly 1 has a space portion therein for receiving an object of inspection.

The following various coils are disposed in such a manner as to surround this space portion: namely, a static magnetic field coil for applying a predetermined static magnetic field $H_O$ to the object; a gradient magnetic field coil for generating a gradient magnetic field for each of the x-, y-and z-axes; an RF transmission coil for applying radiofrequency pulses to the object in order to excite nuclear spins within the object; a reception coil for detecting an NMR signal from the object; etc. (not shown). The static magnetic field coil, the gradient magnetic field coil, the RF transmission coil and the NMR signal receiving coil are connected to a main magnetic field power supply 2, a gradient magnetic field driving circuit 3, an RF power amplifier 4 and a preamplifier 5, respectively. A sequence memory circuit 10 has means for generating a sequence signal for collecting projection data from a plurality of directions, sequence control means for effecting collection of data by the spin warp method in a direction in which the number of samples in the warp direction is minimized, said direction being determined in a computer 13 on the basis of the projection data collected from a plurality of directions, and means for controlling the timing at which the detected NMR signal is subjected to analog-to-digital (A/D) conversion. The sequence memory circuit 10 actuates the gradient magnetic field driving circuit 3, a gate modulating circuit 6 and an A/D converter 11. The gate modulating circuit 6 modulates a radio-frequency signal from an RF oscillating circuit 7 in response to a timing signal from the sequence memory circuit 10 and applies the modulated radio-frequency signal to theRF power amplifier 4. A phase detector 8 uses the output of the RF oscillatin9 circuit 7 as a reference si9nal to carry out phase detection of an NMR signal which is detected by the reception coil and delivered through the pre-amplifier 5 and applies the NMR signal to the A/D converter 11. The A/D converter 11 subjects the NMR signal obtained through the phase detector 8 to analog-to-digital conversion and applies the converted NMR signal to the computer 13. The computer 13 exchanges information with a control console 12, rewrites the contents of the sequence memory circuit 10 in order to realize various scanning sequences, performs calculation for reconstructing the distribution of information concerning the resonance energy into an image by the use of data supplied from the A/D converter 11, and outputs data concerning the reconstructed image to a display 9.

The operation of the above-described arrangement will next be explained.

Under a uniform static magnetic field $H_O$ produced by the main magnetic field power supply 2, the sequence memory circuit 10 actuates the gradient magnetic field driving circuit 3 and the gate modulating circuit 6 in accordance with instructions from the computer 13 so as to generate each of the gradient magnetic fields and radio-frequency pulses in a predetermined sequence. The sequence memory circuit 10 further actuates the A/D converter 11 so as to convert an NMR signal detected by the phase detector 8 into a digital signal.

Figure 2:
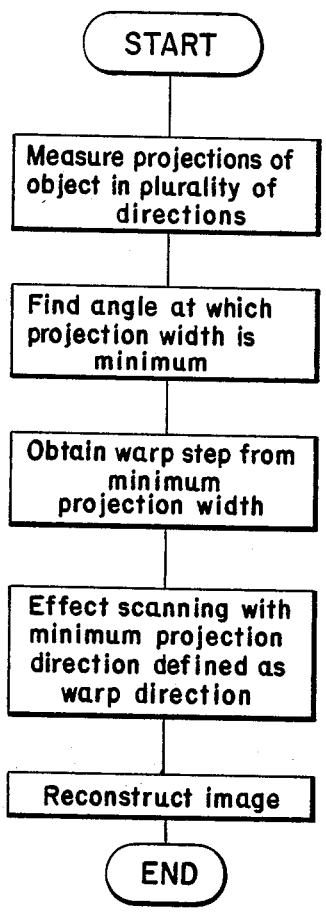
Figure 3:
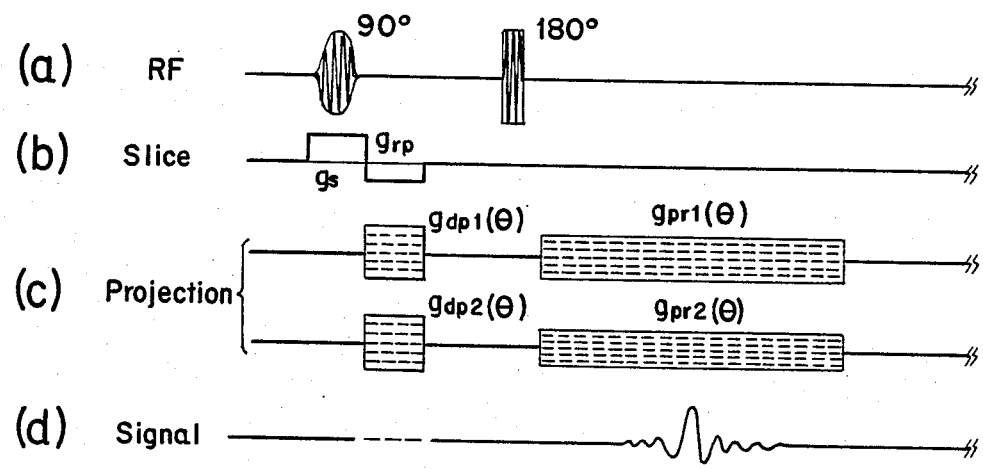

FIG. 2 illustrates a procedure for scanning carried out by the cooperation of the sequence memory circuit 10 and the computer 13. Referring to FIG. 2, first, projections of an object of inspection in a plurality of directions are measured, and an angle $\theta_{min}$ at which the projection width has a minimum value is obtained. To obtain a projection in a direction at a desired angle $\theta$, gradients are applied using the sequence shown in FIG. 3, that is, the sequence based on a known projection reconstruction method and in accordance with the following:

$$g_{dp1}(\theta) = g_{dp}\cos\theta$$
$$g_{dp2}(\theta) = g_{dp}\sin\theta$$
$$g_{pr1}(\theta) = g_{pr}\cos\theta$$
$$g_{pr2}(\theta) = g_{pr}\sin\theta$$

Figure 4:
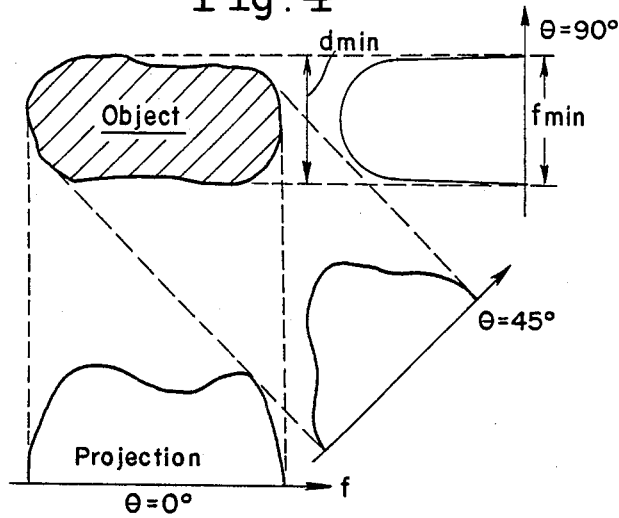

Collected data is then subjected to the Fourier transformation to obtain projection of the object in the $\theta$ direction as shown in FIG. 4. Projections in a plurality of $\theta$ directions are obtained, and one which has a minimum projection width is selected therefrom. In the example shown in FIG. 4, $$\theta_{min} = 90°.$$

Then, a warp step $g_w$ is obtained from the projection width in the $\theta_{min}$ direction. If it is assumed that the projection width in the $\theta_{min}$ direction is represented by $f_{min}$ [Hz], the absolute size of the object as viewed from the $\theta_{min}$ direction is obtained from the following formula (1):

$$d_{min} = f_{min}/\gamma \cdot g_{pr} \quad (1)$$

wherein:

$\gamma$ ... gyromagnetic ratio

If it it is assumed that the warp step, the effective field of view in the warp direction and the warp time are respectively represented by $\Delta g_w$, d and $T_w$, the relationship given by the formula (2) holds and, hence, the formula (3) is obtained:

$$2\cdot\gamma\cdot T_w\cdot\Delta g_w\cdot d = 2\pi \quad (2)$$

$$\Delta g_w = 1/(\gamma\cdot T_w\cdot d) \quad (3)$$

Accordingly, the warp step $\Delta g_w$ is given by the formula (4):

$$\Delta g_w = 1/(\gamma\cdot T_w\cdot d_{min}) \quad (4)$$

Further, the warp gradient $g_{w(k)}$ in the k-th view is given by the formula (5):

$$g_{w(k)} = \Delta g_w(k - N_v/2) \quad (5)$$

wherein: $N_v$ ... the number of views

It should be noted that in the actual apparatus the effective field of view d in the warp direction is selected so as to be a value obtained by increasing $d_{min}$ in the forumula (3) by about 10% in view of safety.

After the above-described processing, the scanning coordinate system is rotated so that the $\theta_{min}$ direction is coincident with the warp direction by a known method, and scanning is carried out by the use of the value of $g_{w(k)}$ given by the formula (5) and in accordance with the sequence based on the known spin warp method shown in FIG. 6. Thus, collection of data for reconstructing an image is effected. The collected data is then subjected to the two-dimensional inverse Fourier transformation to reconstruct an image. If the maximum amount of warp for obtaining a predetermined resolving power is set at $W_{max}$ [rad/cm], the number of views $N_v$ required therefor is given by the formula (6), and the formula (3) is substituted into the formula (6) to obtain the formula (7):

$$N_v = W_{max}/(2\pi\cdot\Delta\cdot T_w\cdot\Delta g_w) \quad (6)$$

$$N_v = W_{max}\cdot d/2\pi \quad (7)$$

Figure 5A:
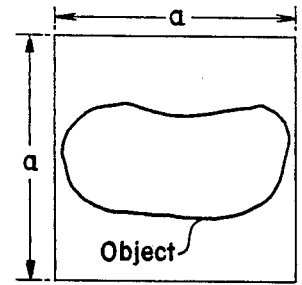
Figure 5B:
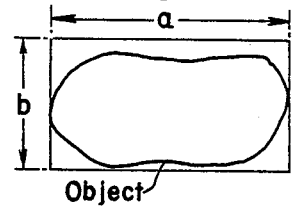

Since in the formula (7) the maximum amount of warp $W_{max}$ is determined by the resolving power only, the number of views $N_v$ is proportional to the effective field of view d. Further, the scanning time may be considered to be proportional to the number of views $N_v$. Accordingly, if the area of a×b (a>b) shown in FIG. 5(b) is scanned with the direction b defined as the warp direction, the scanning time is reduced by b/a as compared with scanning of the area of a x a show in FIG. 5(a).

It should be noted that the present invention is not necessarily limited to the above-described embodiment and may be applied to any scanning which uses the Fourier transformation method.

As has been described above, according to the present invention, the scanning coordinate system is rotated in a direction in which the number of samples in the warp direction is minimized on the basis of projection data concerning an object of inspection which is collected from a plurality of directions and an image is reconstructed using data collected under the coordinates obtained thereby. It is therefore possible to effect scanning within a minimum time which can be desired for each individual object. Accordingly, it is possible to reduce the burden on the object and weaken the possibility that an artifact due to the movement of the object's body may be generated.

Although the present invention has been described above by way of the best mode for carrying out it, it will be easy for those who have ordinary knowledge of the technical field to which the present invention belongs to make various modifications without departing from the scope of the following claims.

I claim:

1. In an NMR imaging method wherein a static magnetic field, gradient magnetic fields in x-, y- and z- directions and a radio-frequency electromagnetic wave are applied to an object of inspection to measure an NMR signal from the object, and a cross-sectional image of the object is reconstructed on the basis of the NM signal; the improvement comprising the steps of measuring a projection with respect to a desired cross-section of the object in each of a plurality of directions along said desired cross-section;

obtaining a direction in which the width of the measured projection is the smallest;

obtaining a warp step from said smallest width of the measured projection; and measuring the NMR signal from the object on the basis of the Fourier transformation method so that a direction which is perpendicular to the obtained direction is defined as the direction of the coordinate axis of the spin warp.

2. In an NMR imaging apparatus comprising means for applying a static magnetic field to an object of inspection, means for applying gradient magnetic fields in x-,y- and z-directions to the object, means for applying a radio-frequency electromagnetic wave to the object, means for measuring an NMR signal from the object, and means for reconstructing a cross-sectional image of the object on the basis of the measured NMR signal; the improvement comprising means for measuring a projection with respect to a desired cross-section of the object in each of a plurality of directions along said desired cross-section;

means for obtaining a direction in which the width of the measured projection is the smallest;

means for obtaining a warp step from said smallest width of the measured projections; and means for measuring the NMR signal from the object on the basis of the Fourier transformation method so that a direction which is perpendicular to the obtained direction is defined as the direction of the coordinate axis of the spin warp.

* * * * *